US006459335B1

(12) United States Patent
Darmawaskita et al.

(10) Patent No.: US 6,459,335 B1
(45) Date of Patent: Oct. 1, 2002

(54) AUTO-CALIBRATION CIRCUIT TO MINIMIZE INPUT OFFSET VOLTAGE IN AN INTEGRATED CIRCUIT ANALOG INPUT DEVICE

(75) Inventors: Hartono Darmawaskita, Chandler; Layton Eagar, Mesa; Miguel Moreno, Gilbert, all of AZ (US)

(73) Assignee: Microchip Technology Incorporated, Chandler, AZ (US)

(*) Notice: Subject to any disclaimer, the term of this patent is extended or adjusted under 35 U.S.C. 154(b) by 115 days.

(21) Appl. No.: 09/676,389

(22) Filed: Sep. 29, 2000

(51) Int. Cl.$^7$ ................................................ H03F 1/14
(52) U.S. Cl. ............................ 330/9; 330/51; 327/124
(58) Field of Search ........................... 330/9, 51, 69; 327/124, 307

(56) References Cited

U.S. PATENT DOCUMENTS

| 5,061,900 | A | * | 10/1991 | Vinn et al. | 330/9 |
| 6,111,965 | A | * | 8/2000 | Lubbe et al. | 330/51 |
| 6,194,941 | B1 | * | 2/2001 | Zarabadi et al. | 330/9 |
| 6,252,454 | B1 | * | 6/2001 | Thompson et al. | 330/9 |

* cited by examiner

Primary Examiner—Robert Pascal
Assistant Examiner—Khanh Van Nguyen
(74) Attorney, Agent, or Firm—Baker Botts L.L.P.

(57) ABSTRACT

An auto-calibration circuit minimizes input offset voltage in an integrated circuit analog input device. The auto-calibration circuit may also calibrate a plurality of analog input devices on an integrated circuit die or in a multi-chip package (MCP). The auto-calibration circuit and analog input device(s) may be fabricated in combination with a microcontroller system on an integrated circuit die or in an MCP. The auto-calibration circuit controls input offset voltage compensation circuit that counteracts or compensates for input offset voltage so as to minimize voltage error at the output of the analog input device. A digital control circuit applies a digital word to the input offset voltage compensation circuit for generating the required input offset voltage compensation. A linear search or binary search of various values of the digital word may be used by the digital control circuit. The digital control circuit switches the inputs, the output and feedback-gain determining resistors for the analog input device during a calibration mode. A voltage comparator compares the output of the analog input device and a voltage reference. When the output of the analog input device is equal to or greater than the voltage reference, the comparator output signals the digital control circuit by changing its output logic level. The input offset voltage compensation circuit of the analog input device has a storage register or memory that retains the digital word which compensates for the input offset voltage.

33 Claims, 4 Drawing Sheets

AUTO-CALIBRATION CIRCUIT TO MINIMIZE INPUT OFFSET VOLTAGE IN AN INTEGRATED CIRCUIT ANALOG INPUT DEVICE

BACKGROUND OF THE INVENTION

The invention relates to integrated circuit analog input devices and, more particularly, to an auto-calibration circuit for minimizing input offset voltage in the integrated circuit analog input device.

DESCRIPTION OF THE RELATED TECHNOLOGY

Integrated circuits are becoming far more sophisticated while continuing to drop in price. Combinations of both analog and digital functions fabricated on an integrated circuit die, or packaged in a multi-chip package (MCP), are becoming more prevalent and are further increasing the usefulness and reducing the cost of consumer and industrial products. The combination of a microcontroller, and analog and digital circuit functions on an integrated circuit die or in an MCP has also expanded the useful range of applications. Consumer and commercial products, such as, for example, but not limited to, appliances, telecommunications devices, automobiles, security systems, full-house instant hot water heaters, thermostats and the like, are being controlled by integrated circuit microcontrollers. Analog inputs for receiving sensor information and analog outputs for controlling functions are necessary for the application of these microcontrollers. Heretofore separate and discrete analog-to-digital and digital-to-analog interfaces were used to connect the digital microcontroller to the outside analog world.

Analog input devices such as an analog-to-digital converter (ADC) in conjunction with a separate operational amplifier (op-amp) were used to convert a time-varying analog signal into digital representations thereof for application to digital inputs and use thereof by the microcontroller. Voltage and current levels were also detected by discrete integrated circuit voltage comparators that changed a digital output state when a certain analog value was present on the input of the comparator.

The op-amp (and comparator) is generally a differential input (inverting and noninverting inputs) analog device, and the circuit of the op-amp has inherent direct current (DC) input offset voltage that causes the output of the op-amp to be nonzero with a zero input voltage between the differential inputs. Many applications require an op-amp with a very small input offset voltage. To achieve small input offset voltage, normally a calibration step in the production of the op-amp is required. This calibration step takes time during manufacturing/testing and is therefore generally expensive to perform. The calibration is typically performed at one operating point (e.g., temperature, common mode voltage, etc.) such that changes in operating environment are not compensated for. Technology has now advance to the point where the analog input and output devices can be fabricated on the same integrated circuit die on which the digital microcontroller and its support logic and memories are also fabricated. This creates an additional problem in that the equipment used to test the digital microcontroller functions are not capable of performing on-line calibration of analog functions efficiently.

What is needed is an integrated circuit having both analog and digital functions, where the analog functions may be easily calibrated during initial manufacturing/testing and, additionally, may be calibrated in a system application so as to remain in or meet the desired specifications and operating parameters over all operating temperature, voltage, current, speed, power, pressure, humidity, etc., that may be encountered during normal operation and can be mass-produced to reduce overall product costs.

SUMMARY OF THE INVENTION

The invention overcomes the above-identified problems as well as other shortcomings and deficiencies of existing technologies by providing in a single integrated circuit package an auto-calibration circuit to minimize input offset voltage in an integrated circuit analog input device. The auto-calibration circuit may also be utilized to calibrate a plurality of analog input devices on an integrated circuit die or in an MCP. The auto-calibration circuit and analog input device(s) may be fabricated in combination with a microcontroller system on an integrated circuit die or in an MCP. The auto-calibration circuit of the present invention may quickly and easily compensate for input offset voltage of the analog input device. This compensation may be performed during initial manufacturing/testing and, in addition, may be performed at various times during the operation of the analog input device so as to more effectively maintain desired parameters and specifications over all of the operating conditions of temperature, voltage, current, speed, power, pressure, humidity, etc.

In an embodiment of the auto-calibration circuit of the present invention, the analog input device has input offset voltage compensation or a trimming circuit that counteracts or compensates for the device input offset voltage by applying, for example, but not limited to, an opposite polarity voltage between the differential inputs of the analog input device so as to minimize the resulting voltage error at the output of the analog device. Switching of resistances, current sources and/or voltage sources in the differential input circuit of the analog input device may be used to compensate for the input offset voltage error. In addition, a digital-to-analog converter (DAC) may be used to generate a compensation voltage to overcome the input offset voltage error. Other ways of compensating for the input offset voltage error now known or used in the future may be utilized in the present invention so long as they can be controlled by applying a digital value thereto.

A digital control circuit is used to apply a digital word to the input offset voltage compensation circuit for determining a digital value representative of the required input offset voltage compensation. A linear search or binary search of various digital values of the digital word may be used by the digital control circuit. In addition, the digital control circuit may also control switching the inverting and non-inverting inputs, the output, and the feedback gain determining resistors of the analog input device during a "calibration mode" thereof.

A voltage comparator compares the output of the analog input device and a voltage reference. When the output of the analog input device is equal to or greater than the voltage reference, the comparator output switches from a first logic level to a second logic level. The output of the comparator is connected to the digital control circuit and signals the digital control circuit by changing its output logic level.

The voltage reference may be programmably adjustable for selecting a desired reference voltage value to be applied to the analog input device and comparator inputs during the calibration cycle. This feature of the invention allows the ability to vary the voltage reference so as to facilitate calibration at the common mode voltage which is very close to that of the application of use. The appropriate voltage reference value may be written to a control register associated with the voltage reference circuit before initiating the auto calibration of the analog input device. Different voltage reference values may be used for different analog input devices during input offset voltage compensation calibration thereof.

The input offset voltage compensation circuit of the analog input device may have a storage register or memory that retains the digital value required for compensating the input offset voltage. This storage register may be volatile or nonvolatile depending upon the application desired.

In another embodiment of the invention, a plurality of analog input devices may have their input offset voltages compensated for by multiplexing the digital control circuit and comparator between each of the plurality of analog input devices. Thus circuits and die area are reduced, saving costs and improving reliability of the embodiment of the present invention.

A feature of the invention is auto-calibration of dc input offset voltage for an analog input device at any time during operation of the device.

Another feature is auto-calibration of dc input offset voltages for a plurality of analog input devices.

Another feature is auto-calibration of dc input offset voltage of an analog input device in combination with a microcontroller on an integrated circuit die.

Still another feature is a microcontroller-controlled auto-calibration of dc input offset voltage of an analog input device.

Yet another feature is a programmably adjustable voltage reference for selecting a desired reference voltage value to be applied to the analog input device and comparator inputs during the calibration cycle.

An advantage of the present invention is not having to calibrate an analog input device during manufacturing/testing of the device.

Another advantage is being able to dynamically calibrate the analog input device on demand and during operation thereof over all operating conditions.

Still another advantage is using only one auto-calibration circuit to calibrate a plurality of analog input devices on an integrated circuit die or in an MCP.

Another advantage is using the same auto-calibration circuit for calibrating both op-amp and comparator analog input devices.

Other and further features and advantages will be apparent from the following description of presently preferred embodiments of the invention, given for the purpose of disclosure and taken in conjunction with the accompanying drawings.

DETAILED DESCRIPTION OF THE PREFERRED EMBODIMENTS

Figure 1:
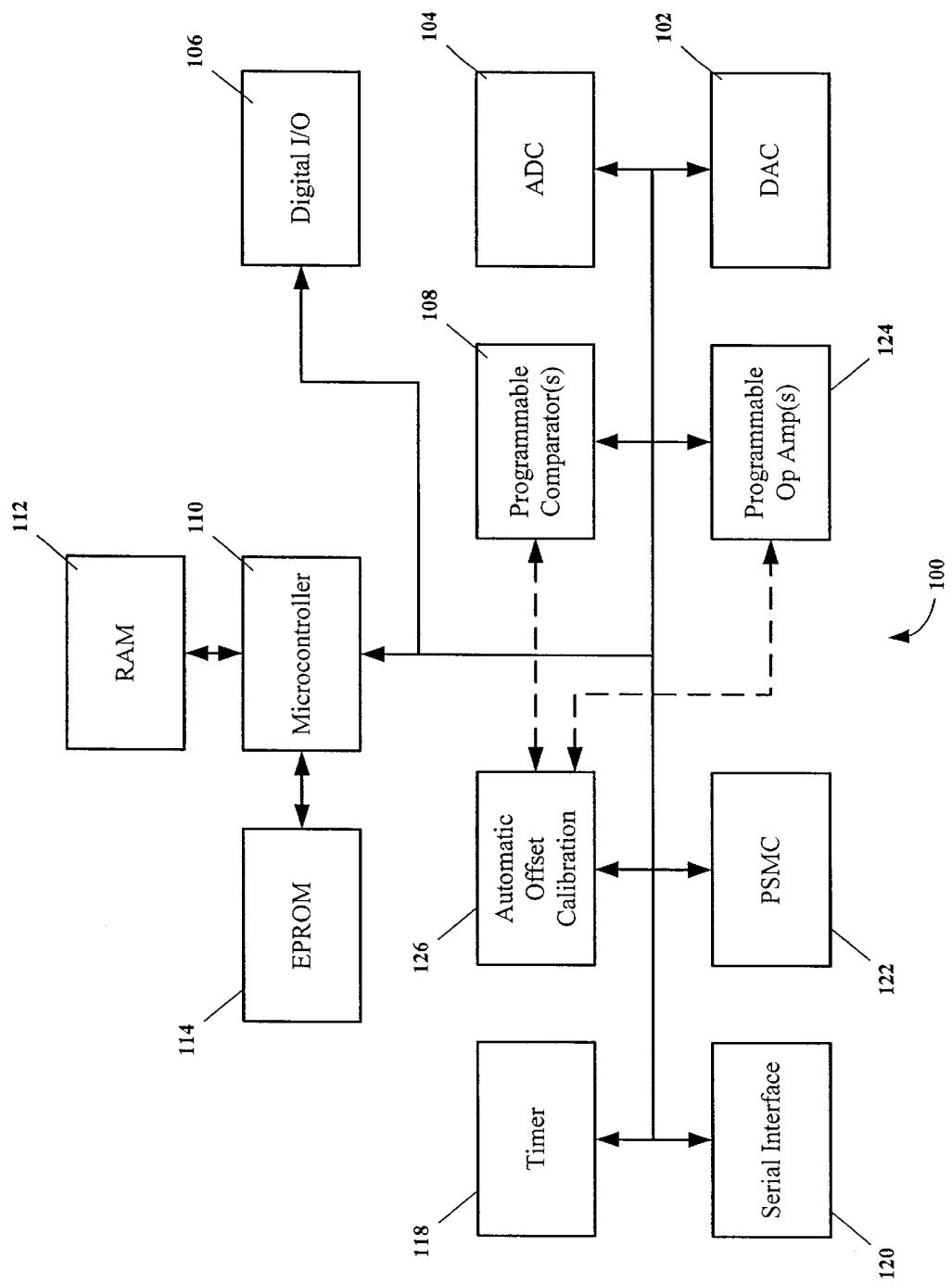
FIG. 1 is a schematic block diagram of a microcontroller system having integral analog and digital peripherals and input-output functions in a single integrated circuit.

The invention is an auto-calibration circuit used in combination with an analog input device to minimize input offset voltage of the analog input device. The invention may be used to maintain close tolerance specifications of the analog input device over a wide range of operating conditions. The auto-calibration circuit may also be used in combination with a microcontroller system fabricated on an integrated circuit die or in an MCP. The auto-calibration circuit of the present invention may also be used with a plurality of analog input devices fabricated on an integrated circuit die or in an MCP.

The auto-calibration circuit and analog input device(s) are preferably fabricated on the same integrated circuit die or in the MCP as a microcontroller system and therefore becomes a very low cost analog peripheral of the microcontroller. Furthermore, the embodiments of the invention will minimize the input offset voltage of the analog device(s) over conditions such as, for example, but not limited to, temperature, voltage, current, power, input common mode, packaging and variations of circuit component values over time, during operation of the analog input device. The analog input device may be, for example, but not limited to, an operational amplifier (op-amp) and/or a voltage comparator.

Referring now to the drawings, the details of preferred embodiments of the invention are schematically illustrated. Like elements in the drawings will be represented by like numbers, and similar elements will be represented by like numbers with a different lower case letter suffix.

Referring to FIG. 1, a schematic block diagram of a microcontroller system having integral analog and digital peripherals and input-output functions in a single integrated circuit is illustrated. The integrated circuit microcontroller system having integral analog and digital peripherals is generally represented by the numeral 100 and comprises a digital-to-analog converter (DAC) 102, an analog-to-digital converter (ADC) 104, digital input-output (I/O) 106, a programmable comparator(s) 108, a microcontroller 110, random access memory (RAM) 112, electrically programmable read-only memory (EPROM) 114, a timer 118, a serial interface 120, a programmable switching mode controller (PSMC) 122 and a programmable operational amplifier(s) (op-amp) 124. FIG. 1 is a schematic block diagram that is illustrative of a typical microcontroller system on an integrated circuit die or in an integrated circuit package having at least one integrated circuit die (MCP). It is contemplated and within the scope of the present invention that the microcontroller system 100 may have more or fewer functions than what is illustrated in FIG. 1.

The microcontroller system 100 may be fabricated on one or more integrated circuit dice and enclosed in an integrated circuit package. The integrated circuit package may be, for example, but not limited to, plastic dual in-line package (PDIP), small outline (SO), shrink small outline package (SSOP), thin shrink small outline package (TSSOP), windowed ceramic dual in-line package (CERDIP), leadless chip carrier (LCC), plastic leaded chip carrier (PLCC), plastic quad flatpack package (PQFP), thin quad flatpack package (TQFP), pin grid array (PGA), ball grid array (BGA), T0-220, T0-247 and T0-263.

Figure 2:
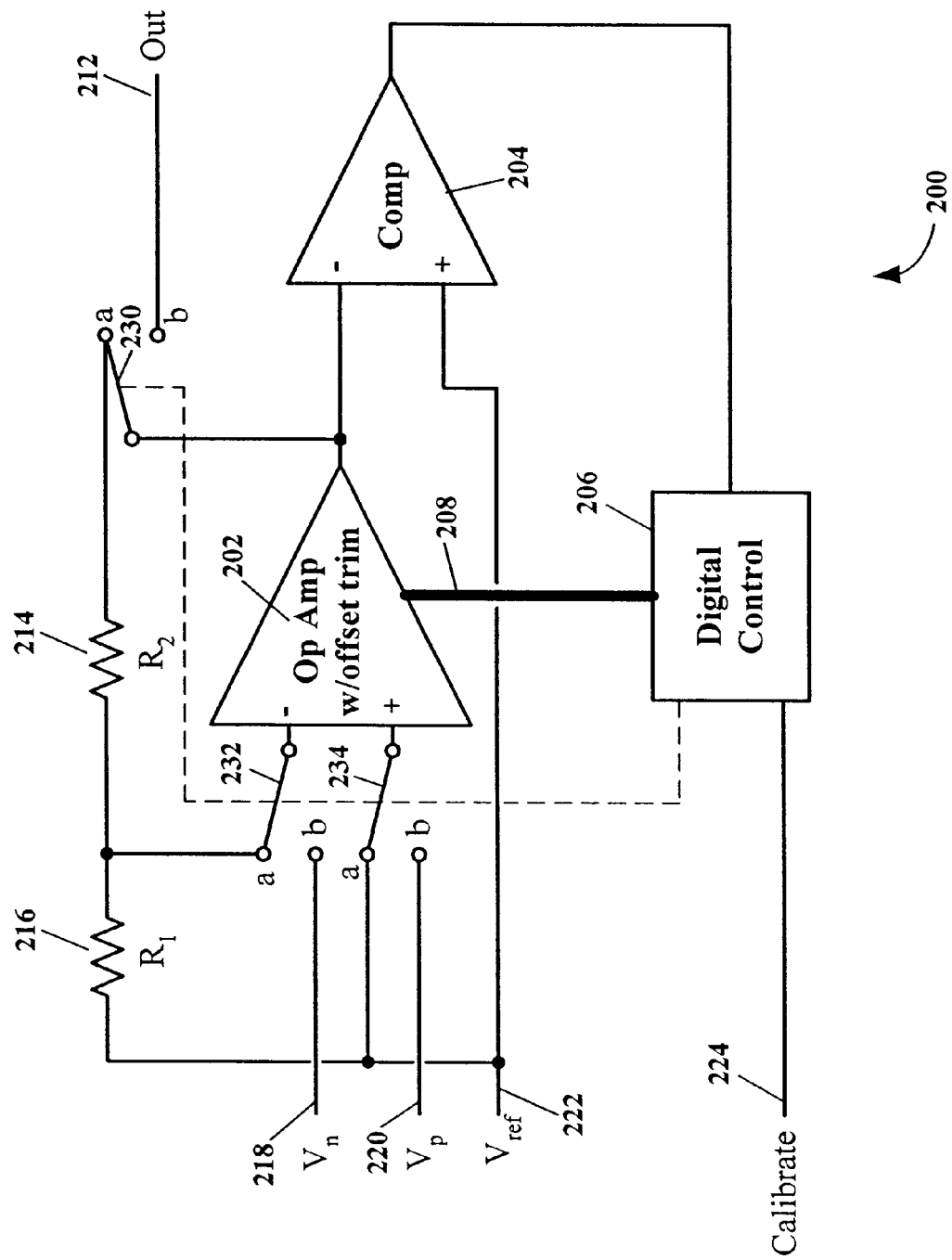
FIG. 2 is a schematic block diagram of an analog input device having an auto-calibration circuit to minimize input offset voltage of the device, according to the present invention.

Referring now to FIG. 2, a schematic block diagram of an analog input device having an auto-calibration circuit to minimize input offset voltage of the device, according to an embodiment of the invention, is illustrated. The analog input device and auto-calibration circuit are generally indicated by the numeral 200 and generally comprise, for example, but not limited to, an op-amp 202 having an offset trim circuit, a comparator 204, digital control 206, switches 230, 232 and 234, and gain-control feedback resistors 214 and 216. The op-amp 202 has a noninverting input (+) and an inverting input (−), which are configured as differential inputs, and an output connected to an inverting input of the comparator 204. The offset trim circuit of the op-amp 202 is generally comprised of a digital-to-analog converter (DAC) has a digital input adapted for receiving a digital value representative of the offset trim value required. The output of the offset trim circuit is an analog value (voltage and/or current) representative of the digital value. The DAC offset trim circuit adjusts a current and/or voltage through either the inverting or non-inverting signal input of the op-amp 202 to compensate for the offset voltage caused by device process mismatch, finite open loop gain, etc. The polarity of the offset determines which signal input is adjusted.

The digital control 206 has an output bus 208, which controls the offset trim circuit and the switches 230, 232 and 234. The offset trim circuit of the op-amp 202 compensates for input offset voltage that would drive the output of the op-amp 202 to an undesired value when the inputs of the op-amp 202 are at substantially the same voltage potential. The digital control 206 is activated by a calibrate command on node 224 and is terminated when the digital control 206 has completed a search to determine a calibration digital word which best compensates for the op-amp 202 offset voltage.

At the start of calibration, analog switches 230, 232 and 234 switch to position "a" from a normal operating position "b." The inputs of the op-amp 202 are thereby connected to a reference voltage 222, and a gain-control resistor feedback network, comprising resistors 214 and 216, are connected to the op-amp 202 so as to establish a high-gain circuit for determining subsequent calibration input voltage offset compensation. When the switches 230, 232 and 234 are in position "a" (calibrate), they effectively establish a high gain differential input amplifier circuit (op-amp 202) having both inputs connected to a voltage reference, Vref. Vref defines the input common mode voltage that the op-amp 202 will be calibrated at. The voltage reference, Vref, is also connected to an input of the comparator 204 so as to maintain a common reference. The output of the op-amp 202 is connected to the other input of the comparator 204.

The output voltage (as referenced to ground) of the op-amp 202 is given by formula (1) below:

$$Vout \approx Vref \pm Vos(1+R2/R1) \tag{1}$$

Where:
Vout=op-amp (amplifier) output voltage
Vref=reference input voltage
Vos=op-amp (amplifier) offset
R1, R2=resistors used to set feedback gain of op-amp when compensating for offset as shown by formula (1) above.

The output voltage of op-amp 202 is mainly determined by the ratio of R2 and R1 and the magnitude of the offset voltage of op-amp 202. The output of op-amp 202 drives the inverting input, and Vref drives the noninverting input of comparator 204. At the start of calibration, the output of op-amp 202 will cause the output of comparator 204 to a logic level state depending upon the magnitude and polarity of the op-amp 202 input offset voltage. The output voltage (as referenced to ground) of comparator 204 is given by formula (2) below:

$$Vocmp \approx (Vout - Vref \pm Voscmp)*Aolcmp + Vcmo \tag{2}$$

Where:
Vocmp=comparator output voltage
Vout=op-amp output voltage
Vref=reference input voltage
Voscmp=comparator offset
Aolcmp=comparator open loop gain
Vcmo=comparator common mode output voltage The op-amp 202 offset voltage is amplified using the resistor network R1, R2 around the op-amp 202 so as to reduce errors that may be introduced by the comparator 204 offset and its finite open-loop gain. For example, given the following parameters:
Vocmp=3.5 volts (output voltage to drive digital cells to a correct state)
Vref=2.5 volts
Voscmp=1 mv
Aolcmp=80 dB
Vcmo=2.5 volts Using formula (1), Vout is determined to be 1.1 mv. This is the minimum output voltage required to drive the comparator 204 output to a magnitude sufficient to drive digital cells to the correct state. For a resistive gain of (1+R2/R1)=50, the minimum residual op-amp 202 offset error due to the comparator errors is determined to be 22 microvolts. These comparator errors define the minimum offset voltage to which the op-amp 202 may be calibrated.

The digital control 206 senses the output logic level from the comparator 204 and, based on the logic level state, sets the polarity of the op-amp 202 calibration network. The digital control 206 performs a search by adjusting the calibration word on the output bus 208 while sensing the logic level change at the output of the comparator 204 until the optimal calibration word for minimum offset voltage is found, within the quantization error of the offset trimming circuit of the op-amp 202. The calibration trim step size is preferably larger than the error calculated from formula (2), due to the comparator 204 errors. Once calibration is complete, the digital control 206 controls the switches 230, 232 and 234 so that they are back to position "b" for normal operation of the op-amp 202. The aforementioned calibration process may be periodically repeated when an operating parameter(s) may have changed. The input offset error is thereby substantially compensated for under all operating conditions. This also allows the analog input device to maintain close tolerance to desired specifications for more critical or demanding applications.

Figure 3:
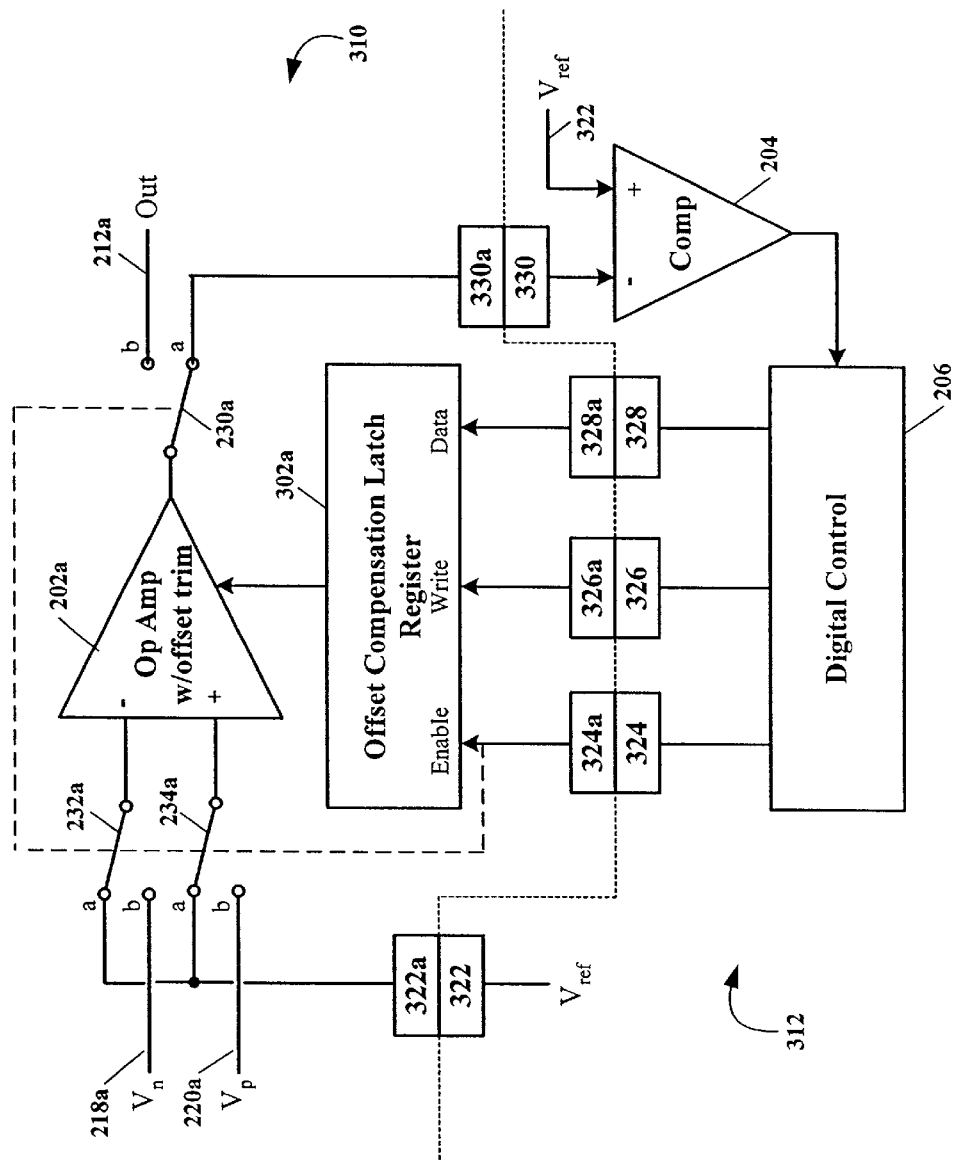
FIG. 3 is a schematic circuit diagram of another embodiment of the invention of FIG. 2.

Referring to FIG. 3, a schematic circuit diagram of another embodiment of the invention of FIG. 2 is illustrated. The op-amp 202a, an offset compensation latch register 302a, analog switches 230a, 232a and 234a and gain-feedback resistors (not illustrated) comprise an analog input device adapted for input voltage offset compensation, generally represented by the numeral 310. The digital control 206 and comparator 204 comprise an auto-calibration circuit, generally represented by the numeral 312, for adjusting the offset trim of the op-amp 202a for optimal performance as disclosed hereinabove.

The digital control 206 has a control output 324 that indicates and starts the calibration process by causing switches 230a–234a to switch to position "a" (calibration mode) and enables the offset compensation latch register 302a to begin accepting data at bus input 328a. The digital control 206 sends digital values over bus 328 so as to minimize the input voltage offset of the op-amp 202a. Linear search, binary search and the like may be used to generate the digital values from the digital control 206. When the digital control 206 detects the comparator 204 output logic level change indicating that the output signal from the op-amp 202a is at a minimum, the offset trim compensation circuit has the desired digital value from the bus 328, and the offset compensation latch register 302a stores this digital value. Once calibrated, the digital control 206 returns the analog input device 310 back to normal operation (switches 230a–234a are returned to position "b").

Figure 4:
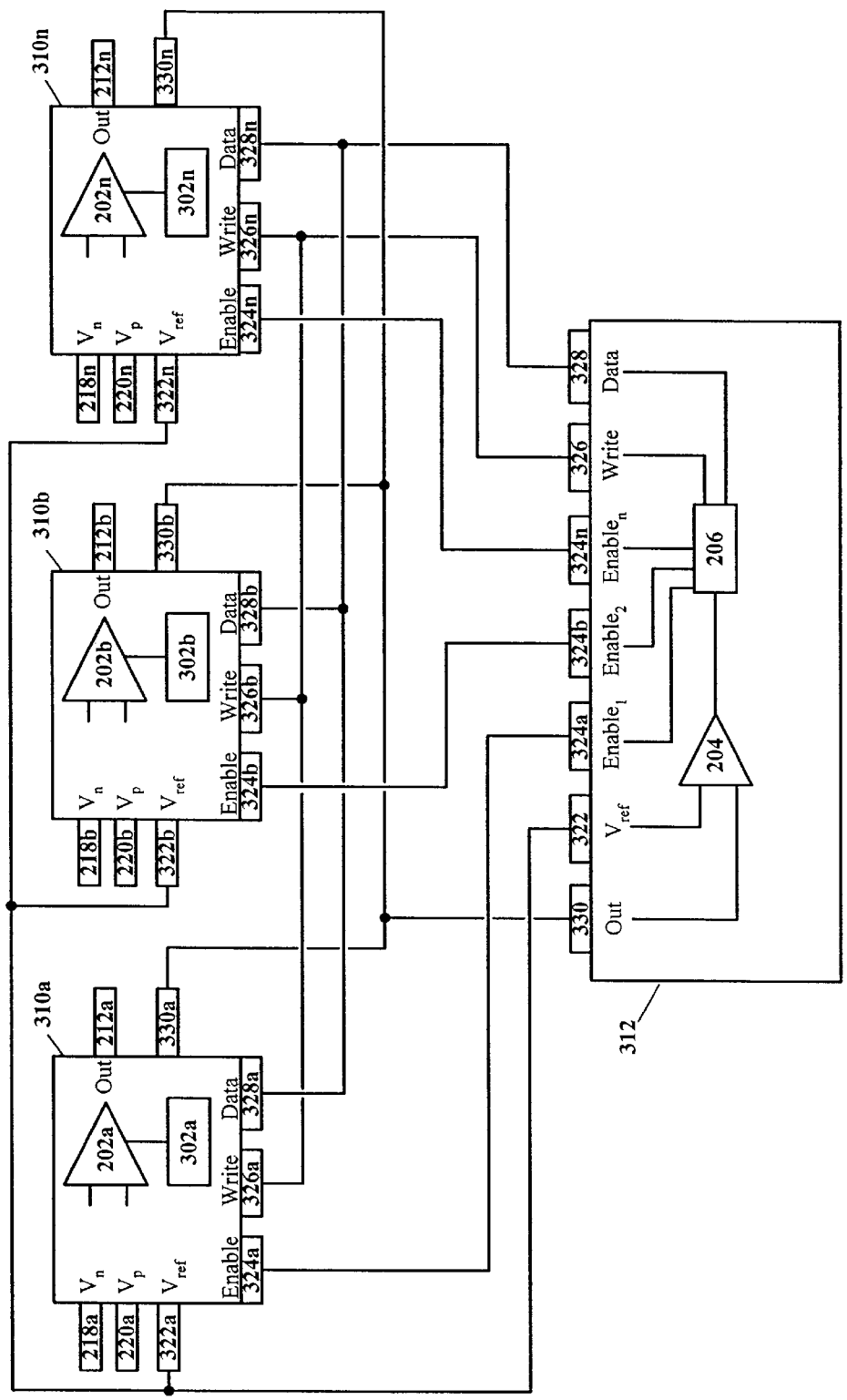
FIG. 4 is a schematic circuit diagram of another embodiment of the invention having a plurality of analog input devices and one auto-calibration circuit.

Referring to FIG. 4, a schematic circuit diagram of another embodiment of the invention having a plurality of analog input devices and one auto-calibration circuit is illustrated. A plurality of analog input devices 310 may be calibrated for minimum input offset with a single auto-calibration circuit 312. One of the plurality of analog input devices 310 is selected by the auto-calibration circuit 312 for input offset calibration thereof. The remaining plurality of analog input devices 310 remain in their normal operating modes. In this way, each of the plurality of analog input devices 310 may be calibrated for minimum input offset, as described hereinabove.

It is contemplated and within the scope of the invention that the auto-calibration circuit 312 and the plurality of analog input devices 310 may be fabricated on an integrated circuit die (not illustrated) and, further, may be utilized with a microcontroller system (FIG. 1) fabricated on an integrated circuit die or in an MCP.

The invention, therefore, is well adapted to carry out the objects and attain the ends and advantages mentioned, as well as others inherent therein. While the invention has been depicted and described and is defined by reference to particular preferred embodiments of the invention, such references do not imply a limitation on the invention, and no such limitation is to be inferred. The invention is capable of considerable modification, alternation and equivalents in form and function, as will occur to those ordinarily skilled in the pertinent arts. The depicted and described preferred embodiments of the invention are exemplary only and are not exhaustive of the scope of the invention. Consequently, the invention is intended to be limited only by the spirit and scope of the appended claims, giving full cognizance to equivalents in all respects.

What is claimed is:

1. An integrated circuit having at least one analog input device and an auto-calibration circuit to minimize input offset voltage in the at least one analog input device, comprising:
   at least one analog input device having a digitally controlled input offset voltage compensation circuit; and
   an auto-calibration circuit, said auto-calibration circuit being coupled to said at least one analog input device and to the input offset voltage compensation circuit, whereby input offset voltage is minimized in said at least one analog input device during a calibration cycle, wherein during the calibration cycle:
   inverting and non-inverting inputs of said at least one analog input device are connected to a voltage reference; and
   said auto-calibration circuit monitors a signal on an output of said at least one analog input device and adjusts the input offset compensation circuit so as to minimize the input offset of said at least one analog input device.

2. The integrated circuit of claim 1, wherein said at least one analog input device is an operational amplifier.

3. The integrated circuit of claim 2, wherein said at least one analog input device is a comparator.

4. The integrated circuit of claim 2, wherein said auto-calibration circuit comprises a comparator and a digital control circuit.

5. The integrated circuit of claim 1, wherein said auto-calibration circuit causes said at least one analog input device to have high gain during the calibration cycle.

6. The integrated circuit of claim 5, wherein the auto-calibration circuit comprises:
   a digital control circuit having an output connected to the input offset compensation circuit; and
   a comparator having a first input connected to the voltage reference, a second input connected to the output of said at least one analog input peripheral and an output connected to the digital control circuit, wherein a logic level change in the output of said comparator indicates to said digital control circuit that the input offset voltage has been minimized.

7. The integrated circuit of claim 6, further comprising an offset compensation latch register connected between the input offset compensation circuit and said digital control circuit.

8. The integrated circuit of claim 7, further comprising a switching network for selecting from a plurality of analog input devices each one during a calibration cycle therefor.

9. The integrated circuit of claim 1, wherein the voltage reference is programmably adjustable for selecting a desired reference voltage value.

10. The integrated circuit of claim 1, wherein a microcontroller, said at least one analog input device, and said auto-calibration circuit are fabricated on a single integrated circuit die.

11. The integrated circuit of claim 10, further comprising circuit functions selected from the group consisting of a random access memory, an electrically programmable read only memory, a serial interface, an analog-to-digital converter, a digital-to-analog converter, digital input-output, a timer, and a programmable switching mode controller.

12. The integrated circuit of claim 11, wherein said microcontroller, said at least one analog input peripheral, said auto-calibration circuit, and said circuit fimctions are fabricated on a single integrated circuit die.

13. The integrated circuit of claim 12, further comprising an integrated circuit package enclosing said integrated circuit die.

14. The integrated circuit of claim 13, wherein said integrated circuit package is selected from a group consisting of plastic dual in-line package (PDIP), small outline (SO), shrink small outline package (SSOP), thin shrink small outline package (TSSOP), windowed ceramic dual in-line package (CERDIP), leadless chip carrier (LCC), plastic leaded chip carrier (PLCC), plastic quad flatpack package (PQFP), thin quad flatpack package (TQFP), pin grid array (PGA), ball grid array (BGA), T0-220, T0-247 and T0-263.

15. An analog input device having an auto-calibration circuit to minimize input offset voltage in the device, comprising:
   an analog input device having a digitally controlled input offset voltage compensation circuit; and
   an auto-calibration circuit, said auto-calibration circuit being coupled to said analog input device and to the input offset compensation circuit, whereby input offset voltage is minimized in said analog input device during a calibration cycle, wherein during the calibration cycle:

inverting and non-inverting inputs of said analog input device are connected to a voltage reference; and said auto-calibration circuit monitors a signal on an output of said analog input device and adjusts the input offset compensation circuit so as to minimize the input offset of said analog input device.

16. The analog input device of claim 15, wherein said analog input device is an operational amplifier.

17. The analog input device of claim 15, wherein said analog input device is a comparator.

18. The analog input device of claim 15, wherein said auto-calibration circuit comprises a comparator and a digital control circuit.

19. The analog input device of claim 15, wherein the voltage reference is programmably adjustable for selecting a desired reference voltage value.

20. The analog input device of claim 15, wherein said auto-calibration circuit causes said analog input device to have high gain during the calibration cycle.

21. The analog input device of claim 20, wherein the auto-calibration circuit comprises:

a digital control circuit having an output connected to the input offset voltage compensation circuit; and a comparator having a first input connected to the voltage reference, a second input connected to the output of said analog input device and an output connected to the digital control circuit, wherein a logic level change in the output of said comparator indicates to said digital control circuit that the input offset voltage has been minimized.

22. The analog input device of claim 21, further comprising an offset compensation latch register connected between the input offset compensation circuit and said digital control circuit, wherein the offset compensation latch register stores a digital value representative of the minimized input offset determined during the calibration cycle of said analog input device.

23. The analog input device of claim 22, further comprising a switching network for selecting each one of a plurality of analog input devices during a calibration cycle therefor, wherein each of the plurality of analog input devices has a digitally controlled input offset voltage compensation circuit.

24. The analog input device of claim 23, further comprising an offset compensation latch register for each one of the plurality of analog input devices, and connected between the input offset compensation circuit of each of said plurality of analog input devices and said digital control circuit, wherein each respective offset compensation latch register stores a digital value representative of the minimized input offset determined during the calibration cycle for each one of said plurality of analog input devices.

25. The analog input device of claim 15, wherein said analog input device and said auto-calibration circuit are fabricated on a single integrated circuit die.

26. The analog input device of claim 25, further comprising an integrated circuit package enclosing said integrated circuit die.

27. The analog input device of claim 26, wherein said integrated circuit package is selected from a group consisting of plastic dual in-line package (PDIP), small outline (SO), shrink small outline package (SSOP), thin shrink small outline package (TSSOP), windowed ceramic dual in-line package (CERDIP), leadless chip carrier (LCC), plastic leaded chip carrier (PLCC), plastic quad flatpack package (PQFP), thin quad flatpack package (TQFP), pin grid array (PGA), ball grid array (BGA), T0-220, T0-247 and T0-263.

28. A method for minimizing an input offset voltage in an analog input device, said method comprising the steps of:

(a) switching from a normal mode to a calibration mode an analog input device having an input offset voltage compensation circuit;

(b) applying a reference voltage to the analog input device;

(c) minimizing an input offset voltage of the analog input device with an auto-calibration circuit by:
(i) measuring an output voltage of the analog input device; and
(ii) applying input offset compensation values to the input offset voltage compensation circuit until the output voltage from the analog input device is at a desired value and then storing the input offset compensation value that minimizes the input offset voltage of the analog input device; and (d) switching the analog input device from the calibration mode to the normal mode.

29. The method of claim 28, wherein the step of switching the analog input device to a calibration mode includes the step of configuring the analog input device for high gain.

30. The method of claim 28, wherein the step of applying a reference voltage further comprises the step of applying a programmably adjustable reference voltage.

31. A method for minimizing input offset voltages in a plurality of analog input devices, said method comprising the steps of:

(a) switching from a normal mode to a calibration mode each one of a plurality of analog input devices, wherein each one has an input offset voltage compensation circuit;

(b) applying a reference voltage to the one of the plurality of analog input devices that is switched to the calibration mode;

(c) minimizing an input offset voltage of the one that is switched to the calibration mode with an auto-calibration circuit by;
(i) measuring an output voltage of the one that is switched to the calibration mode; and
(ii) applying input offset compensation values to the input offset voltage compensation circuit of the one until the output voltage from the one is at a desired value and then storing the input offset compensation value that minimizes the input offset voltage of the one;

(d) switching the one from the calibration mode back to the normal mode; and (e) repeating steps a through f until each one of the plurality of analog input devices has its input offset voltage minimized.

32. The method of claim 31, wherein the step of applying a reference voltage further comprises the step of applying a programmably adjustable reference voltage.

33. The method of claim 32, wherein the step of applying a programmably adjustable reference voltage further comprises the step of applying a specific value of the programmably adjustable reference voltage for each one of the plurality of analog input devices being calibrated.

* * * * *